United States Patent [19]

Takahashi

[11] Patent Number: 4,648,725
[45] Date of Patent: Mar. 10, 1987

[54] GUIDE MECHANISM

[75] Inventor: Kazuo Takahashi, Kawasaki, Japan

[73] Assignee: Canon Kabushiki Kaisha, Tokyo, Japan

[21] Appl. No.: 771,300

[22] Filed: Aug. 30, 1985

[30] Foreign Application Priority Data

Sep. 4, 1984 [JP] Japan .................. 59-183803

[51] Int. Cl.$^4$ ............... F16C 29/02; F16C 29/04
[52] U.S. Cl. ............................. 384/9; 384/10; 384/25; 384/58; 384/37
[58] Field of Search ............ 308/3 R, 3 A, 6 R, 6 C, 308/3.8; 384/9, 10, 25, 58, 40, 37

[56] References Cited

U.S. PATENT DOCUMENTS

4,515,415  5/1985  Szenger .................... 308/3 R
4,529,255  7/1985  Piotrowski ................. 308/6 C
4,547,024  10/1985  Teramachi ................. 308/6 C Primary Examiner—Lenard A. Footland
Attorney, Agent, or Firm—Fitzpatrick, Cella, Harper & Scinto

[57] ABSTRACT

A device for guiding movement of a stage, carrying thereon a semiconductor wafer, for printing in a reduced scale an integrated circuit pattern of a mask onto different portions of the semiconductor wafer through a reduction production lens, includes linear roller bearings for supporting the stage for movement in a predetermined direction, a slider and a roller for pressing a portion of the stage against the slider to thereby constrain the displacement of the stage in a direction perpendicular to the predetermined direction of movement, whereby higher accuracies of the stop position of the stage as well as higher speed of the stage movement are assured.

9 Claims, 12 Drawing Figures

GUIDE MECHANISM

FIELD OF THE INVENTION AND RELATED ART

This invention relates to a guide mechanism for guiding relative movement between two members. More particularly, the invention is concerned with a movement guiding device for guiding movement of a first member, such as a workpiece carrying stage, relative to a second member, such as a support base, along a path defined on the second member.

In a field of manufacture of semiconductor devices such as large scales integrated circuits, exposure apparatuses of the reduction projection type are used to print, on a semiconductor wafer, a number of circuit patterns in a matrix fashion with a step-and-repeat technique. Typically, each semiconductor device is manufactured by printing in superimposed fashion plural different circuit patterns on the same area of the wafer through repetition of exposures with different reticles or photomasks. In such exposure process, a circuit pattern which is now going to be printed on the wafer must be accurately overlaid on an already printed circuit pattern or patterns. Also, reduction in time for the step-and-repeat operation is desired in order to improve working efficiency. For these reasons, a moving system for a wafer stage for moving the wafer along a plane of X-Y coordinates should have the capability of quick starting and stopping the movement of the wafer as of well as higher accuracies for the positioning of the wafer. In order to meet these requirements, various attempts have been made in respect to the system for guiding and moving the wafer stage.

In such type of moving system, usually called an "X-Y table", a guide mechanism is employed to guide the movement of the wafer stage. As for this guide mechanism, various basic types have been proposed and they are shown in FIGS. 3–9.

Figure 3:
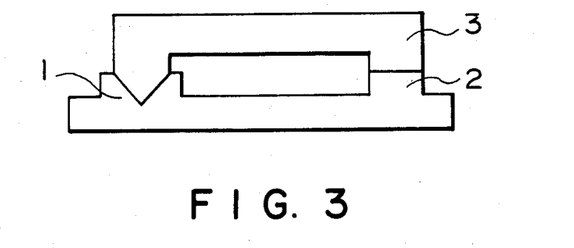
FIGS. 3–9 are front views, respectively, showing known types of movement guiding devices.

The mechanism shown in FIG. 3 has a combination of a V-groove sliding guide 1, which is widely used in the field of ordinary working machines, with a flat-plane sliding guide 2. A movable table 3 is thus constrained so that it is movable only in a one-dimensional direction relative to a support base. Each of the sliding surfaces of the sliding guides 1 and 2 is formed by a metallic surface which is lubricated with an oil or coated with a macromolecular material such as polytetrafluoroethylene (trade name: Teflon) or with a macromolecular composite material such as PTFE, to provide a surface of low coefficient of friction to thereby assure smooth sliding movement.

Figure 4:
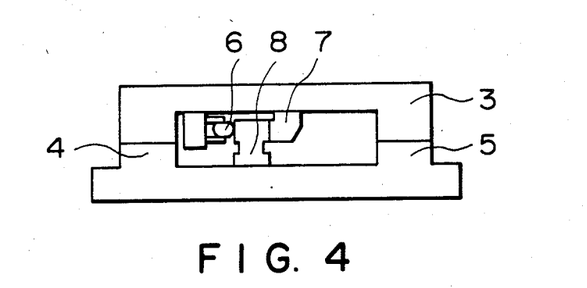

FIG. 4 shows an example in which vertical displacement is constrained by two guides 4 and 5 each having a sliding surface formed by a metallic surface lubricated with an oil or coated with PTFE. On the other hand, lateral displacement is constrained by a combination of a pressing roller 6, to which a biasing force is applied, and a slider 7 sandwiching a guide 8 therebetween. The contacting surfaces of the slider 7 and the guide 8 are lubricated with an oil or coated with PTFE, to assure sliding movement of low coefficient of friction.

Figure 5:
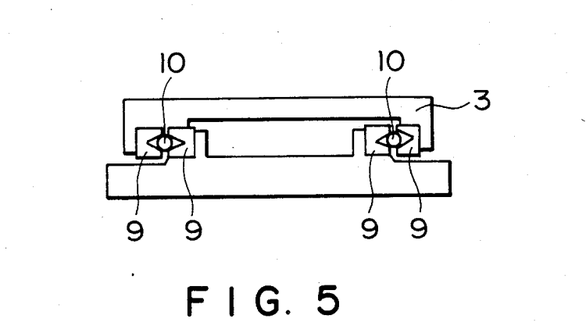

FIG. 5 shows a guide system, which is usually called "cross-roller guide system", having a combination of V-shaped rails 9 and ball bearings 10.

Figure 6:
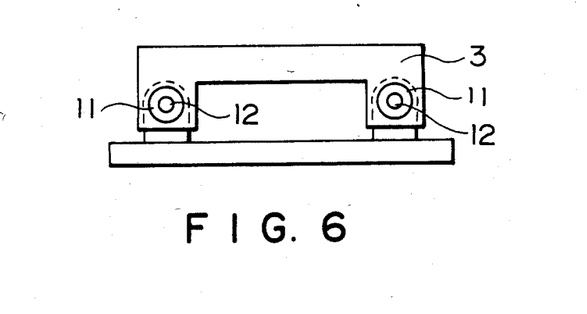

FIG. 6 shows an example having a combination of ordinary linear motion bearings 11 and rod guides 12.

Figure 7:
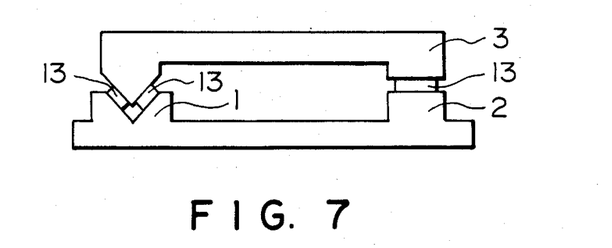

FIG. 7 shows a guide system, similar to the FIG. 3 system, wherein a V-groove sliding guide 1 and a flat plane sliding guide 2 are used in combination with rollers 13.

Figure 8:
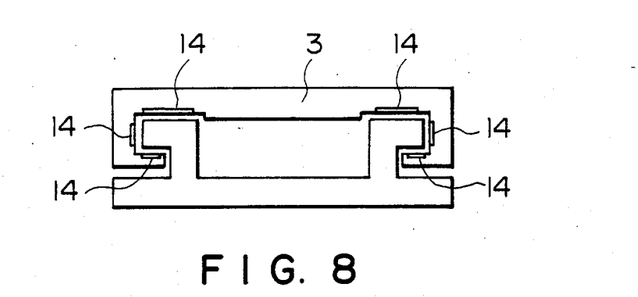

FIG. 8 shows a system in which each of guide portions is formed with plural air pads 14, to provide a non-contact type air bearing. Table 3 is maintained in a floating condition.

Figure 9:
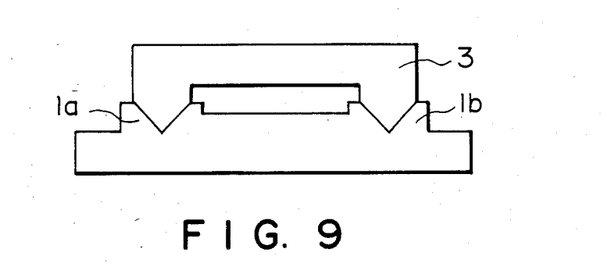

FIG. 9 shows a system having a pair of V-groove sliding guides 1a and 1b, as usually employed in precise machining apparatuses. Basically, the FIG. 9 system is similar to the FIG. 3 system.

In actual stage moving systems for exposure apparatuses, a driving mechanism and a motion transmitting mechanism are connected to a movable stage having a movement guiding device, such as shown in FIGS. 3–9, to form one moving mechanism and there are provided plural moving mechanisms, each as above, which are combined with each other to assure movability in X and Y directions (two orthogonal directions) of X-Y coordinates.

Figure 10:
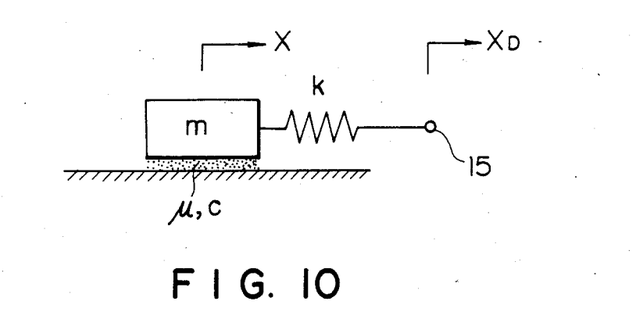
FIG. 10 is a schematic view showing a model of moving system of a guide device.

The wafer carrying table (stage) can be represented by a model such as shown in FIG. 10, wherein m is the mass of a movable portion of the movable table, c is the viscosity coefficient of the guide portion, $\mu$ is the coefficient of rolling friction or sliding friction (Coulomb friction), and k is the stiffness of the motion transmitting mechanism (a spring constant in a case of one-dimensional motion).

In FIG. 10, when the gravitational acceleration is denoted by g and the displacement of a driving point 15 for a particular moment is denoted by $X_D$, the displacement X of the movable table at the same moment can be represented by the following equation of motion:

$$m\ddot{X} + c\dot{X} + k(X - X_D) = -\text{sign}(\dot{X}) \cdot \mu mg$$

In this equation, "sign($\dot{X}$)" is a function which is variable in the following manner:

$$\text{sign}(\dot{X}) = 1 \quad \text{where } \dot{X} > 0;$$
$$\text{sign}(\dot{X}) = 0 \quad \text{where } \dot{X} = 0; \text{ and}$$
$$\text{sign}(\dot{X}) = -1 \quad \text{where } \dot{X} < 0.$$

From the above equation of motion, the natural frequency f of this system is obtainable, such as follows:

$$f = \tfrac{1}{2}\pi \cdot \sqrt{k/m}$$

Figure 11:
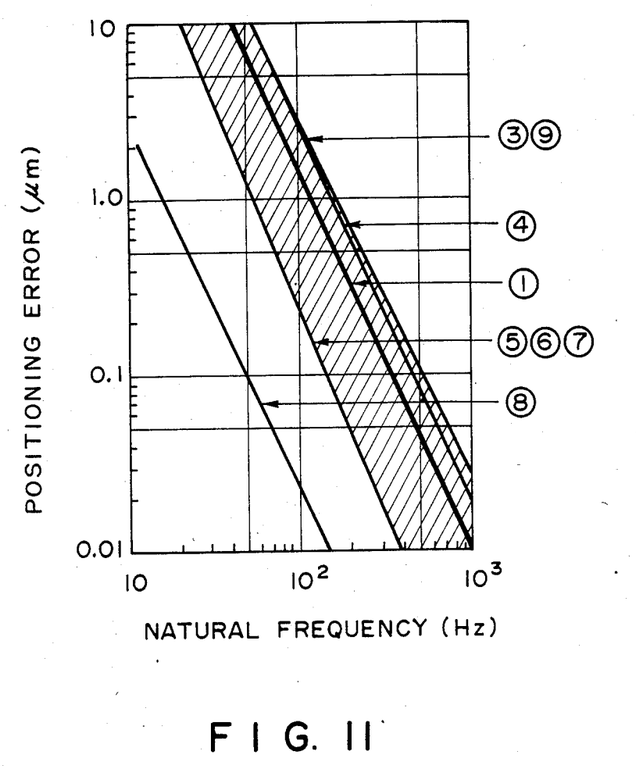
FIG. 11 is a graph showing the relation between the natural frequency of the system and the positioning accuracy.
Figure 12:
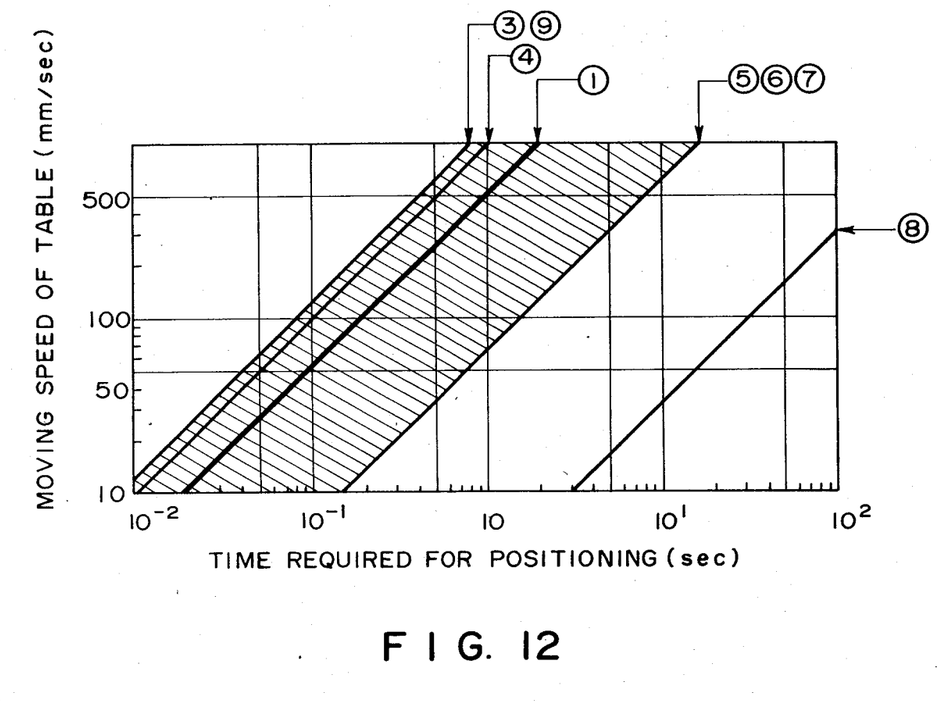
FIG. 12 is a graph showing the relation between the time required for the positioning and the moving speed of the table.

On the basis of the natural frequency f, evaluation was made of each of the guide devices shown in FIGS. 3–9 in terms of a positional error with respect to a stop position, when the drive of the movable table was suddenly stopped at a particular moment. The results of evaluation are shown in FIG. 11. In this Figure, the abscissa shows the natural frequency, while the ordinate shows the positional error. Also, in FIG. 11, characters ③, ④ ... ⑨ denote the positional accuracies obtainable from the devices of FIGS. 3–9, respectively. It is seen from this Figure that the guide devices of different structures produce different positional errors. Additionally, evaluation was made of each of the guide devices of FIGS. 3–9 in terms of the relation between the time t required for the positioning and the moving speed Vo of the table just before it was stopped. The results of evaluation are shown in FIG. 12.

If, in the guide devices of FIGS. 3–9, the movable portions have the same mass and if the transmitting mechanisms have the same stiffness, then all the systems have the same natural frequency f. From this and from FIG. 11, it is seen that a guide system utilizing rolling friction through a rolling element produces a generally smaller error with respect to the stop position, as compared with that caused by a guide device utilizing sliding friction. Particularly, the guide device formed by air bearings produces almost no positional error. On the other hand, in respect to the time required for stopping the table moving at a particular speed, it is seen from FIG. 12 that the guide device formed by air bearings requires the longest positioning time, whereas guide devices utilizing sliding friction are suitable for the system in which repetition of quick starting and prompt stopping are required. Also, from the aforementioned equation of the natural frequency, it is seen that if, for the same guide structure, the mass of the movable portion is reduced and the stiffness of the transmitting mechanism is increased, then the natural frequency of the system is increased so that the error with respect to the stop position can be reduced. Actually, however, decrease in the mass of the movable portion would result in decreased stiffness which disadvantageously affects the moving characteristics other than those with respect to the moving direction, for example, yawing, pitching, rolling, jounce, lateral displacement, etc. If, on the other hand, the stiffness of the transmitting mechanism is increased, then the inertia of the transmitting mechanism becomes so large that can not be neglected, which disadvantageously results in an increase in the error with respect to the stop position.

From the viewpoint of manufacturing techniques, the guide systems shown in FIGS. 3, 5–9 are disadvantageous in terms of manufacturing cost, because in these systems the moving characteristics in the moving direction and the directions other than the moving direction are all determined by the two guide portions, so that precise machining, assembling and adjustment are always required for each of the two guide portions even if accuracies are required only with respect to yawing, for example.

SUMMARY OF THE INVENTION

It is accordingly a primary object of the present invention to provide a movement guiding device which assures improved accuracies for the stop position as well as reduction in time required for the positioning.

It is another object of the present invention to provide a movement guiding device which is suitably applicable to a system for guiding stepwise movement of a semiconductor wafer, in an exposure apparatus for projecting an integrated circuit pattern onto the semiconductor wafer in a step-and-repeat fashion, for the manufacture of semiconductor devices.

Briefly, according to the present invention, there is provided a device for guiding movement of a first member relative to a second member, the device including first means for allowing the movement of the first member relative to the second member in a predetermined direction and for prohibiting displacement of the first member relative to the second member in a first direction which is perpendicular to the predetermined direction, the first means having a roller disposed between the first and second members so that it is rollable with respect to the predetermined direction, and second means for prohibiting displacement of the first member relative to the second member in a second direction which is perpendicular to the predetermined direction and to the first direction, the second means having a slider for providing sliding movement between the first and second members with respect to the predetermined direction.

In one preferred form of the present invention, there is provided a device for guiding movement of a stage, carrying thereon a semiconductor wafer, for printing in a reduced scale an integrated circuit pattern of a mask onto different portions of the semiconductor wafer through a reduction production lens, the device including linear roller bearings for supporting the stage for movement in a predetermined direction, a slider and a roller for pressing a portion of the stage against the slider to thereby constrain the displacement of the stage in a direction perpendicular to the predetermined direction of movement, whereby higher accuracies of stop position of the stage as well as higher speed of the stage movement are assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
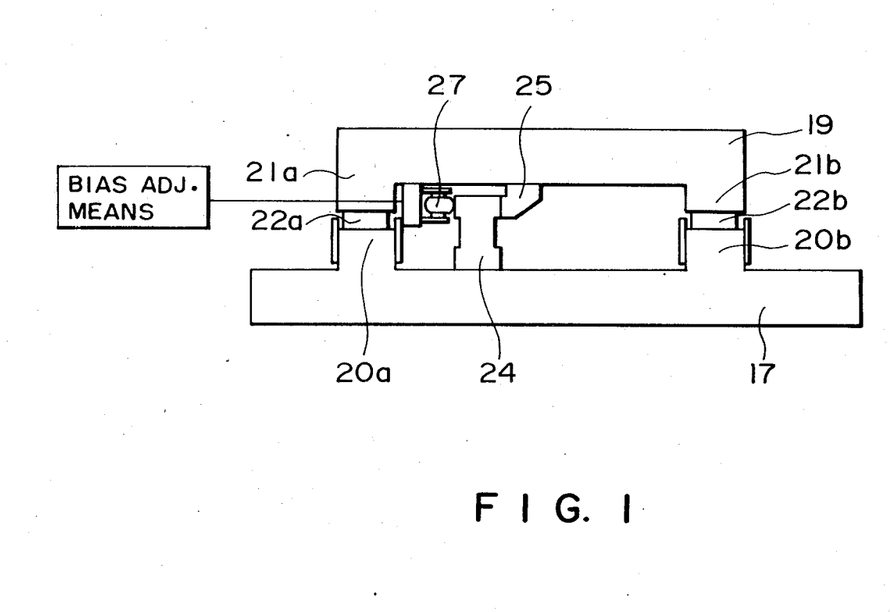
FIG. 1 is a front view showing a basic structure of a movement guiding device according to one embodiment of the present invention.

Referring to FIG. 1, there is shown a basic structure of a movement guiding device according to one embodiment of the present invention. In this embodiment, the invention is applied to a linear guide for guiding linear movement of a movable table 19 as a first member relative to a base 17 as a second member along a path extending in a direction perpendicular to the sheet of FIG. 1.

Fixedly provided on the base 17 are a pair of parallel guide rails 20a and 20b having horizontally extending guide surfaces. Disposed on the guide surfaces of the guide rails 20a and 20b are linear roller bearings 22a and 22b each having a plurality of substantially cylindrical rollable elements arrayed equidistantly by means of an unshown retainer. Each linear roller bearing may be replaced by a linear ball bearing having similarly arrayed spherical rollable elements. On the other hand, the table 19 has, on its lower portion, a pair of fixedly provided guide shoes 21a and 21b which are arranged to ride on the roller bearings 22a and 22b, respectively. These guide rails, roller bearings and guide shoes cooperate with each other to constitute first guide means.

While in this embodiment both the guide rails 20a, 20b and the guide shoes 21a, 21b protrude such as shown in FIG. 1, this is not a requirement. For example, one of the pair of the guide rails and the pair of the guide shoes may have surfaces coplanar with the upper surface of the base 17 or the lower surface of the movable table 19.

The device further includes second guide means which is comprised of another rail 24 fixedly provided on the base 17, extending in parallel to the guide rails 20a and 20b and having vertical guide surfaces, a sliding guide shoe 25 mounted on the lower part of the table 19, and a pressing roller unit 27.

The guide rail 24 has the guide surfaces formed on its opposite side faces, to provide vertical guide surfaces for guiding movement of the table 19 in a direction perpendicular to the sheet of FIG. 1, while preventing displacement of the table 19 in a direction perpendicular to the moving direction of the table 19, i.e. prohibiting displacement of the table 19 in a lateral direction as viewed in FIG. 1.

While in FIG. 1 only one sliding guide shoe 25 is shown, the device actually has two such sliding guide shoes fixedly secured to the table 19 along the guide rail 24 so that their sliding surfaces are in sliding contact with one of the guide surfaces i.e., right-hand side guide surface as viewed in FIG. 1, of the guide rail 24. It is a possible alternative to provide an integral sliding guide shoe having separate sliding surfaces. In any case, it is preferable to provide plural sliding surfaces which are in sliding contact with the guide surface of the guide rail 24.

Each of the sliding surfaces of the sliding guide shoes 25 is formed by a material having a low coefficient of friction, such as a hardwearing metal (e.g. phosphor bronze), a sintered metal, an organic compound (polytetrafluoroethylene) or a composite of these materials.

Also as for the pressing roller unit 27, the device actually has two such pressing roller units, though only one is shown in FIG. 1, which are mounted on the table 19 along the guide rail 24 and at positions corresponding to the sliding guide shoes 25. It is a possible alternative to dispose only one pressing roller unit 27 at a position corresponding to the middle of the two sliding guide shoes 25. As a further alternative, three or more pressing roller units may be provided. Each pressing roller unit 27 has a pressing roller which is biased by an unshown spring toward the guide rail 24, such that the pressing roller unit 27 is adapted to sandwich the guide rail 24 between its pressing roller and an associated one of the sliding guide shoes 25. The biasing force applied to the pressing roller of each pressing roller unit 27 is adjustable by a bias adjusting means, diagrammatically shown in FIG. 1, which includes an adjusting screw arranged to adjust the biasing force of the spring when it is rotated. By adjusting the biasing force of the spring, it is possible to set or establish, as desired, an apparent coefficient of friction at the sliding contact portion between the guide rail 24 and the sliding guide shoe 25 in the direction of movement of the table 19. It is a possible alternative to provide a piezoelectric device or the like, in place of the adjusting screw, to automatically and continuously control the biasing force of the spring to be applied to the pressing roller. This is preferable because the pressing force of the pressing roller applied to the guide rail 24 and therefore to the sliding guide shoe 25 can be variably controlled in accordance with the movement of the table 19.

In the embodiment of FIG. 1, as described above, the guide means for preventing relative displacement in the vertical direction is provided by a combination of a flat plane and a roller. Thus, the weight of the table is supported through rolling friction which is smaller than sliding friction. Also, the guide means for preventing relative displacement in the lateral direction is provided by a sliding element which is in sliding contact with a portion of the moving table with a sliding contact pressure. Further, the biasing force applied to the sliding element to determine the sliding contact pressure is adjustable or variably controllable as desired.

As described, the movement guiding device of FIG. 1 includes, in combination, sliding guide means utilizing sliding friction which is advantageous to reduce the time required for the positioning and roller guide means utilizing rolling friction which assures high accuracies in the positioning. In addition thereto, the apparent coefficient of friction of the sliding guide in the direction of movement of the table can be adjustable as desired or be made variably controllable. With the above arrangement, the movement guiding device of FIG. 1 shows characteristics such as shown in FIGS. 11 and 12 by numeral ①. Also, by changing the sliding contact pressure of the sliding guide, it is possible to change, as desired, the characteristics of the movement guiding device within a range denoted by a hatched area in each of FIGS. 11 and 12. This adjustment will be made at the time of manufacture of the device, in view of the use of the device, needs or the like. Of course, such adjustment may be made by an operator when the device is actually used.

The movement guiding device of FIG. 1 requires a starting torque which is greater than a steady-state torque, because upon initiation of movement there exists a substantial static friction due to the rolling friction as well as the sliding friction. If desired, however, the torque curve of the drive source can be flattened by variably controlling the pressing force of the pressing roller in such manner that the pressing force is decreased upon initiation of the movement while it is increased to a predetermined level when the steady-state speed is reached.

Figure 2:
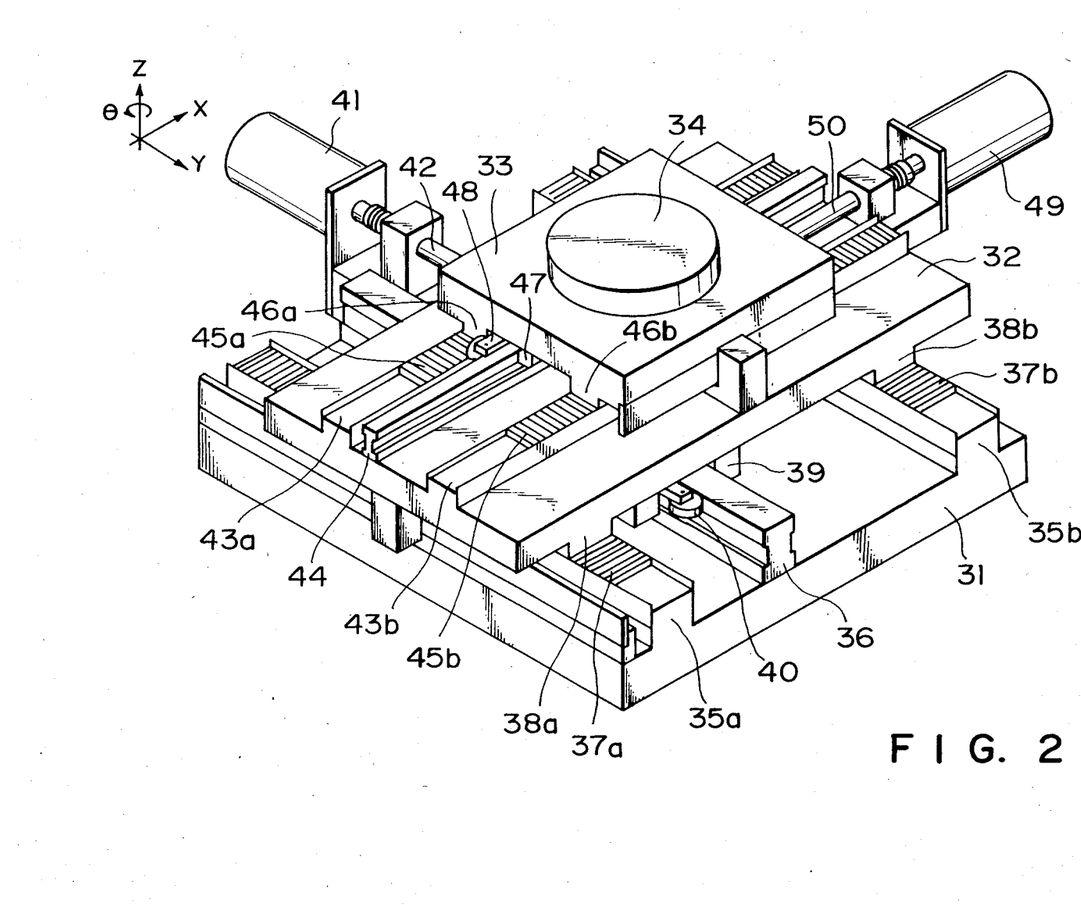
FIG. 2 is a perspective view of a wafer moving system to which a movement guiding device according to the present invention is applied.

The movement guiding device of the present invention can be suitably applied to a wafer moving system of an exposure apparatus. FIG. 2 shows an example of such application.

In FIG. 2 arrangement, there are provided two movement guiding devices combined with each other to allow precise movement of a table in two orthogonal directions X and Y. More particularly, the FIG. 2 arrangement includes a Y-direction guide mechanism, as a first movement guiding system, provided between a base 31 which is a first member and a Y-stage 32 which is a second member, and an X-direction guide mechanism, as a second movement guiding system, provided between the Y stage 32 which is a first member of the second movement guiding system and an X stage 33 which is a second member. Mounted on the X stage 33 is a workpiece carrying table 34 which is arranged to be displaced through a minute distance in the direction of the Z-axis, perpendicular to the X and Y directions, and which is rotatable through a minute angle in a rotational direction $\theta$ about the Z-axis. A wafer (not shown), after it is conveyed onto the table 34, is moved by means of the X stage 33 and Y stage 32 to a desired position in a plane of the X-Y co-ordinates.

The base 31 has a pair of parallel guide rails 35a and 35b having horizontal guide surfaces and another guide rail 36 extending in parallel to the guide rails 35a and 35b and having a vertical guide surface, all of which are fixedly secured to the base 31. Disposed respectively on the horizontal guide surfaces of the guide rails 35a and 35b are linear roller bearings 37a and 37b.

Fixedly provided on the lower surface of the Y stage 32 are a pair of guide shoes 38a and 38b which are adapted to ride on the roller bearings 37a and 37b, respectively, of the guide rails 35a and 35b. Also, a sliding guide shoe 39 and a pressing roller unit 40 are provided on the lower surface of the Y stage 32 so as to oppose each other, such that the guide shoe 39 and the pressing roller unit 40 are in contact with the opposite vertical side surfaces (guide surfaces) of the guide rail 36, respectively. While in FIG. 2 only one sliding guide shoe and only one pressing roller unit are shown, the device actually includes two sliding guide shoes and two pressing roller units, as in the case of the FIG. 1 arrangement, which are disposed along the guide rail 36.

The movement of the Y stage 32 in the Y direction is effected by a drive and transmitting mechanism including a motor 41, a feed screw 42 (which are provided on the side of the base 31), a feed nut (not shown) which is provided on the side of the Y stage 32 and which is in mesh-engagement with the feed screw 42.

Fixedly mounted on the upper surface of the Y stage 32 are a pair of guide rails 43a and 43b and another guide rail 44, all of which extend in parallel to each other. The guide rails 43a and 43b have horizontal guide surfaces and extend perpendicularly to the guide shoes 38a and 38b formed on the lower surface of the Y stage 32, and thus perpendicularly to the guide rails 35a, 35b and 36 of the base 31. The guide rail 44 has two vertical guide surfaces formed on the opposite side faces thereof. Similarly to the Y-direction guide mechanism, linear roller bearings 45a and 45b are disposed on the horizontal guide surfaces of the guide rails 43a and 43b.

Fixedly mounted on the lower surface of the X stage 33 are a pair of guide shoes 46a and 46b which are adapted to ride on the roller bearings 45a and 45b, respectively, of the guide rails 43a and 43b formed on the upper surface of the Y stage 32. Also, a sliding guide shoe 47 and a pressing roller unit 48 are mounted on the lower surface of the X stage 33 so as to oppose to each other, such that they are in contact with the vertical guide surfaces of the guide rail 44, respectively. Similarly, the X-direction guide mechanism actually includes two sliding guide shoes (only one is shown at 47) and two pressing roller units (only one is shown at 48), the shoes and units being disposed along the guide rail 44 as in the case of those provided on the lower surface of the Y stage 32.

Movement of the X stage 33 in the X direction is effected by a drive and transmitting mechanism including a motor 49, a feed screw 50 (which are provided on the side of the Y stage 32), a feed nut (not shown) which is provided on the side of the X stage 33 and which is in mesh-engagement with the feed screw 50.

In this embodiment of the wafer moving system, each of the motors 41 and 49 is a step motor. By applying a predetermined amount of drive to each of the Y stage 32 and X stage 33 from an associated one of the motors 41 and 49 and at a predetermined repetition timing, the Y stage 32 is moved in the Y direction while the X stage 33 is moved in the X direction, both relative to the base 31. During such movements in the Y direction and X direction, each of the Y direction guide mechanism and the X-direction guide mechanism operates to guide the movement of the table 34 in accordance with the positioning characteristics which have been preset or selected, as has been described with reference to FIGS. 11 and 12.

Namely, each of the Y-direction guide mechanism and the X-direction guide mechanism is operative to guide the movement of the table 34 exactly in accordance with the positioning characteristics which have been set at the time of manufacture of the wafer moving system. Of course, this adjustment may be made by an operator when he uses the device. It is also possible to variably control the positioning characteristics of the wafer moving system by variably controlling the pressing force of each of the pressing roller units, as has been described with reference to FIG. 1.

In accordance with the present invention, as has hitherto been described, there is provided a movement guiding device which includes, in combination, first guide means using rolling friction and second guide means using sliding friction, to thereby assure both a satisfactory positioning accuracy and a satisfactorily reduced time for the positioning. Also, the basic structure of the movement guiding device of the present invention allows adjustment of the apparent coefficient of friction in the direction of movement, which is equal to the frictional force in the moving direction as divided by the pressing force produced by the pressing roller unit. Thus, the movement guiding device of the present invention is particularly suitable for use in a moving system in which repetition of quick starts and prompt stops as well as high positioning accuracies are required.

While the invention has been described with reference to the structures disclosed herein, it is not confined to the details set forth and this application is intended to cover such modifications or changes as may come within the purposes of the improvements or the scope of the following claims.

What is claimed is:

1. A device for guiding movement of a first member relative to a second member, said device comprising:
   first means for allowing the movement of said first member relative to said second member in a predetermined direction and for prohibiting displacement of said first member relative to said second member in a first direction which is perpendicular to said predetermined direction, said first means having a rollable element disposed between said first and second members so that said rollable element is rollable in said predetermined direction; and
   second means for prohibiting displacement of said first member relative to said second member in a second direction which is perpendicular to said predetermined direction and to said first direction, said second means having a slidable element for providing sliding friction against relative movement between said first and second members in said predetermined direction; and
   means for adjusting the sliding friction provided by said slidable element without affecting rolling of said rollable element of said first means.

2. A device according to claim 1, wherein said rollable element of said first means comprises at least one of a linear roller bearing and a linear ball bearing.

3. A device according to claim 1, wherein said first means includes a plurality of rollable elements.

4. A device according to claim 3, wherein said slidable element of said second means is disposed at a position between said plural rollable elements.

5. A device according to claim 1, wherein said second means further includes a guide having a guide surface and wherein said slidable element has a sliding surface adapted to be pressed against said guide surface of said guide.

6. A device according to claim 5, wherein said sliding surface of said slidable element of said second means is pressed against said guide surface with a variable pressing force set by said adjusting means.

7. A device according to claim 5, wherein said slidable element of said second means is provided on said first member and wherein said guide of said second means is provided on said second member.

8. A device according to claim 5, wherein said second means includes a roller contactable with said guide to press said sliding surface of said slidable element against said guide surface of said guide.

9. A device according to claim 1, wherein said slidable element of said second means has a sliding surface made of a material of low coefficient of friction.

* * * * *